Figure 1:
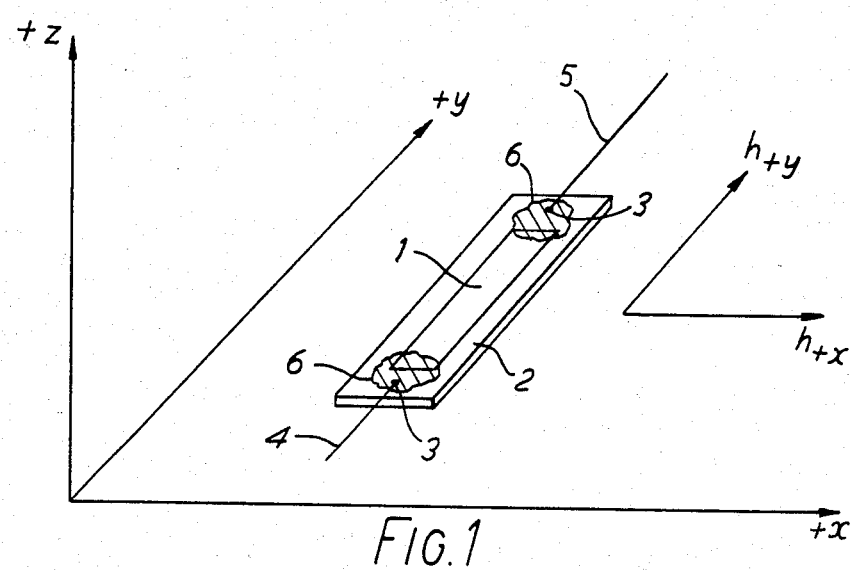

United States Patent [19]

Sansom

[11] Patent Number: 4,525,671
[45] Date of Patent: Jun. 25, 1985

[54] APPARATUS FOR SENSING TWO COMPONENTS OF A MAGNETIC FIELD

[75] Inventor: David J. Sansom, Chertsey, England
[73] Assignee: EMI Limited, Hayes, England
[21] Appl. No.: 415,793
[22] Filed: Sep. 8, 1982

[30] Foreign Application Priority Data

Sep. 9, 1981 [GB] United Kingdom ............... 8127178

[51] Int. Cl.³ .................. G01R 33/06; H01L 43/08; H03K 19/18
[52] U.S. Cl. .................................. 324/252; 307/309; 338/32 R
[58] Field of Search .............. 324/249, 252, 232, 262, 324/235; 338/32 R; 307/309; 365/8

[56] References Cited

U.S. PATENT DOCUMENTS 3,260,932  7/1966  Weiss et al. ..................... 324/252
3,619,772  11/1971  Ellis ................................. 324/249

FOREIGN PATENT DOCUMENTS 1486238  11/1974  United Kingdom .
1473894   5/1977  United Kingdom .

Primary Examiner—Gerard R. Strecker
Assistant Examiner—Walter E. Snow
Attorney, Agent, or Firm—Fleit, Jacobson, Cohn & Price

[57] ABSTRACT

A sensing element suitable for sensing two components $h_x$ and $h_y$ of an external magnetic field in an orthogonal co-ordinate system comprises a reverse C-shape first electrical conductor vacuum deposited onto an electrical insulating substrate. A layer of photoresist applied to a region insulates the conductor from a magnetoresistive element which has two connectors linked thereto. Further application of photoresist insulates the element from a second vacuum deposited electrical conductor. Wires locate with respective conductors where gold deposition in the vicinity of the wire ends achieves electrical continuity. A control circuit applies current, within a periodic cycle, in alternate directions through the first conductor while a current is applied in a single direction through the second conductor. In the following cycle the current direction through the second conductor is reversed. Values of the element electrical resistivity for the four combination of current (and hence magnetic field) directions allow solution of a simultaneous equation to yield $h_x$ and $h_y$.

7 Claims, 15 Drawing Figures

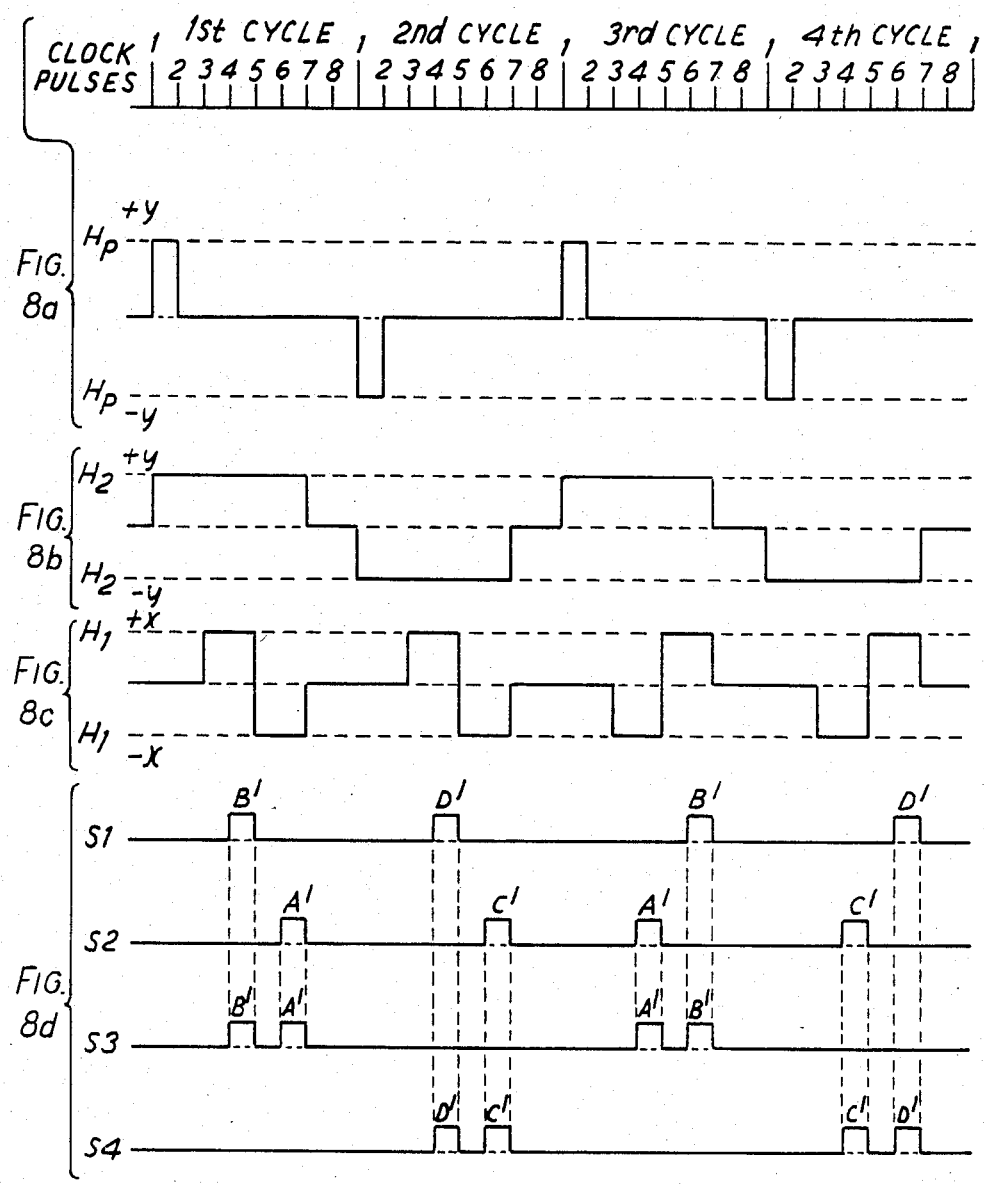

APPARATUS FOR SENSING TWO COMPONENTS OF A MAGNETIC FIELD

This invention relates to arrangements for measurement of components of a magnetic field.

A magnetic field value may be resolved into a number of components dependent on the co-ordinate system selected. Typically a three dimensional orthogonal system is chosen, enabling magnetic field values to be defined in terms of their components along x, y and z axes.

Examination of two components of a magnetic field has generally relied on a sensing element for each component, or rotation of a single sensing element to allow consecutive measurements of the components. A typical sensing arrangement may involve magnetoresistive elements, as for example disclosed in British Patent Specification No. 1473894.

It is an object of this invention to provide an arrangement including a single magnetoresistive element, adapted to evaluate two components of a magnetic field from a single spatial position.

According to one aspect of the invention there is provided apparatus for sensing first and second orthogonal components $h_x$ and $h_y$ of an external magnetic field h, said apparatus including a planar magnetoresistive element, said element comprising a magnetically anisotropic thin film having an easy axis of magnetization in the plane of the film, said film being provided with electrical contacts connectable to means for passing an electrical current through the film in a direction substantially parallel to said easy axis, said contacts also being connectable to detecting means for sensing a signal indicative of the resistivity said film when said current is passed therethrough, said apparatus further including application means for selectively applying to the film a first magnetic bias field and a second magnetic bias field, said first bias field acting substantially at right angles to said easy axis in the plane of the film and said second bias field acting substantially parallel to said easy axis, and control means permitting said first and second bias fields to be applied to said element in a plurality of pre-determined relationships, said element, in use, being placed in said external magnetic field h with said component $h_x$ lying in a direction at right angles to said easy axis in the plane of the film and said component $h_y$ lying parallel to said easy axis, and said detection means sensing signals indicative of the resistivity of said film whilst said application means selectively applies said first and second bias fields in a plurality of different relationships, said relationships being chosen such that said components $h_x$ and $h_y$ may be derived from said signals.

In a preferred embodiment of the invention the resistive variation of the magnetoresistive member with magnetic field is examined, synchronous with modification of the magnetic field direction and intensity established by the magnetic field application means. Current conductors with a magnetic field encompassing the conductor or coils of current conductors with a magnetic field along the axes of the coils may form the appropriate magnetic field application means.

The resistivity of a magnetoresistive element alters in a known way in dependence on the intensity and direction of a magnetic field. A residual external magnetic field, the components of which are to be evaluated, may be superposed upon an applied bias field to yield a resultant magnetic field acting on the magnetoresistive element in a known manner. Alteration and reversal of the axis along which the field may be applied, will produce a number of points on the magnetoresistive element resistivity characteristic. Provided intensity and direction of the bias fields are varied in a known manner, simultaneous equations involving these points may be formed, permitting their solution to furnish the values for the components of the residual external field.

Figure 2:
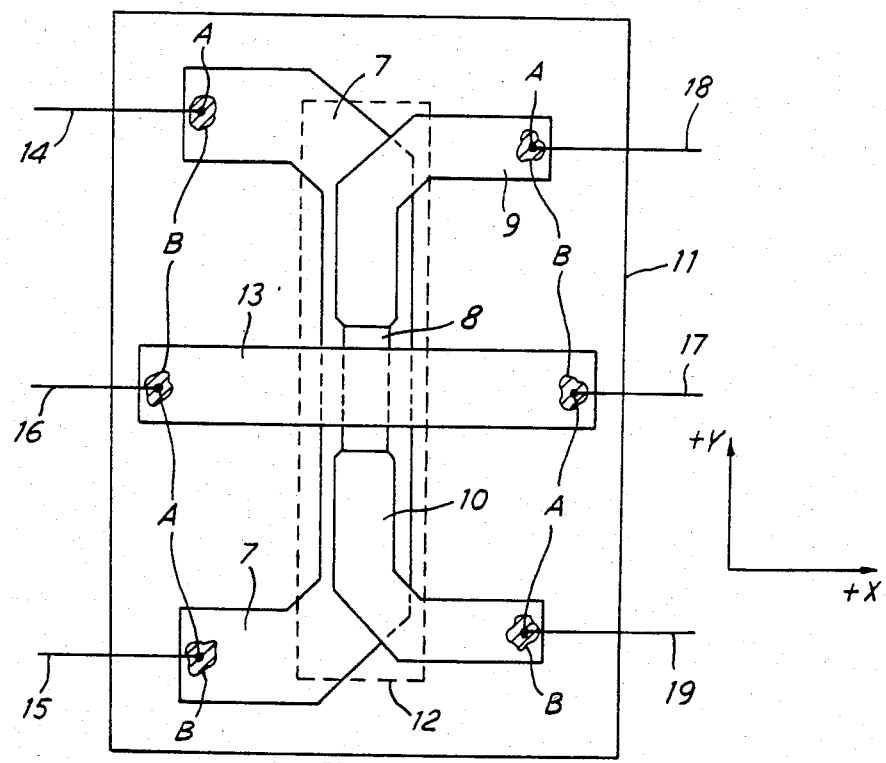
Figure 3A:
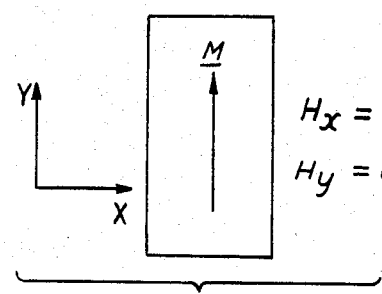
Figure 3B:
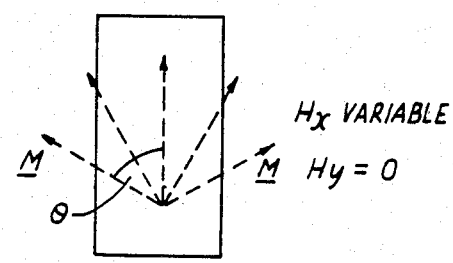
Figure 3C:
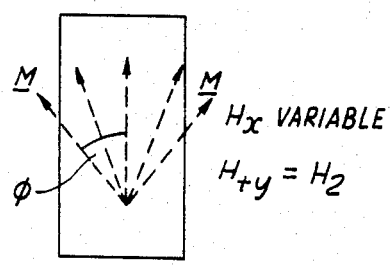
Figure 3D:
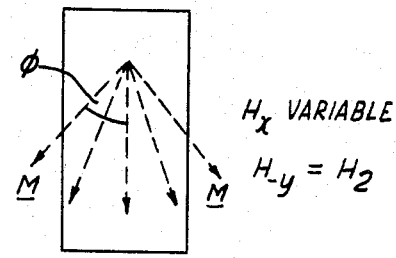
Figure 4:
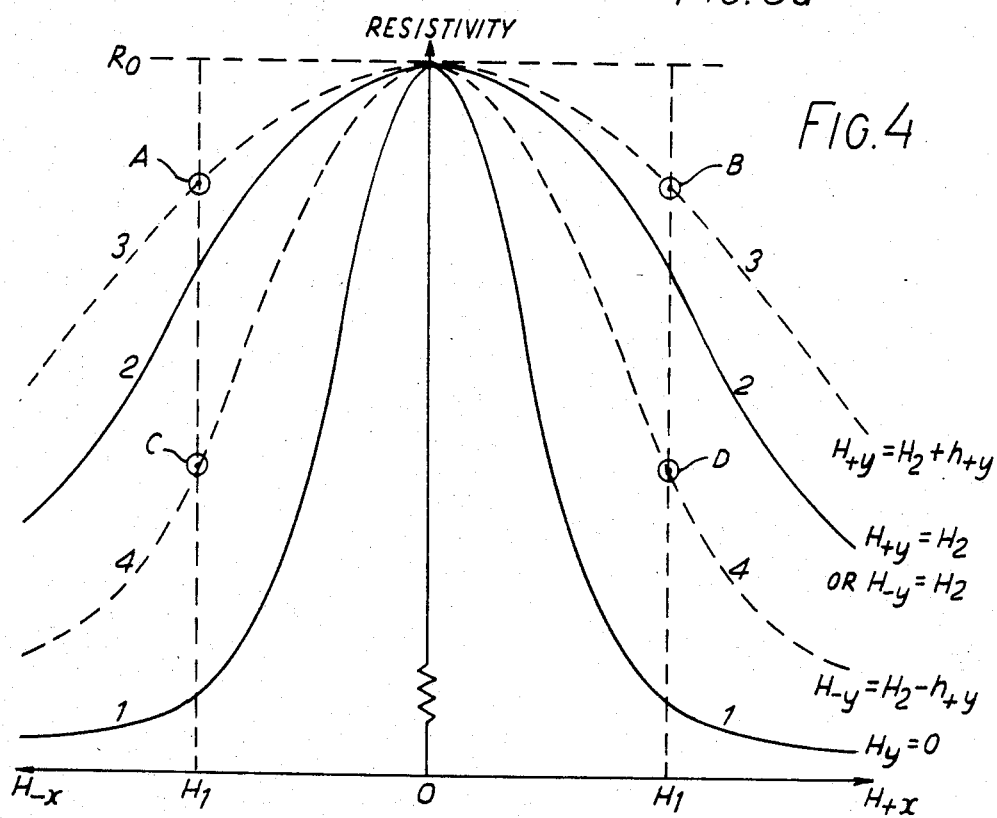
Figures 5A, 5B:
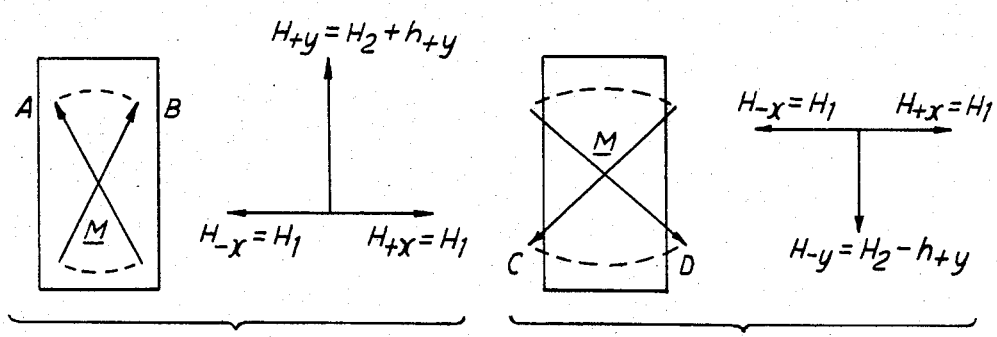
Figure 6:
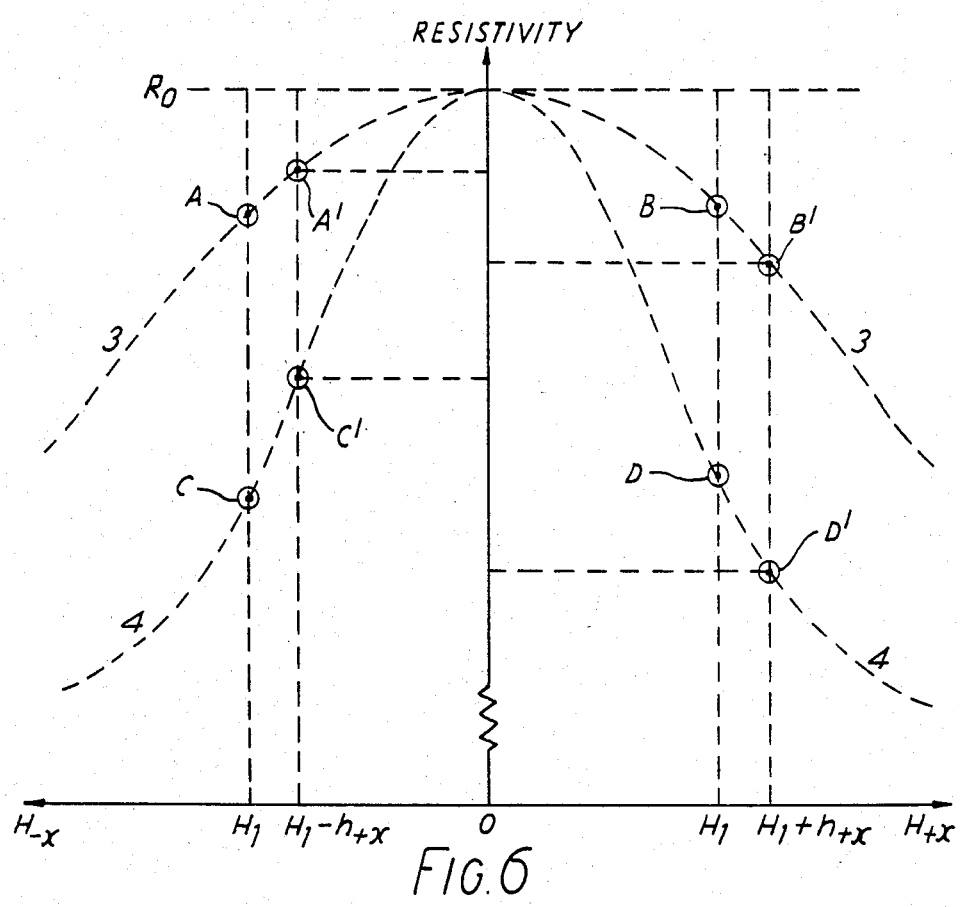
Figure 7:
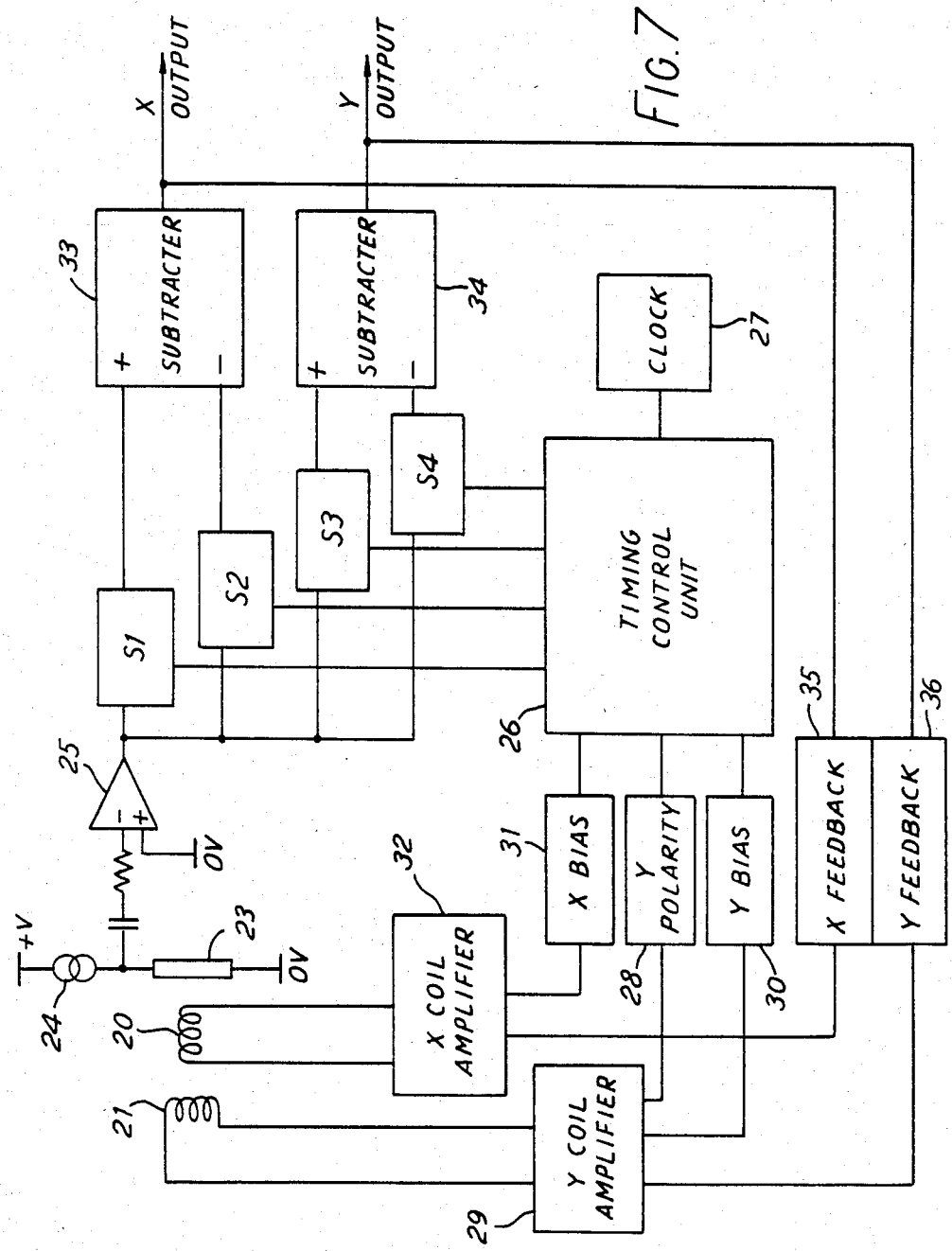

For a better understanding of the invention and to show how the same may be carried into effect, reference will now be made by way of example, to the accompanying drawings, in which:

FIG. 1, illustrates a magnetoresistive element and its relative co-ordinate system, FIG. 2, illustrates a magnetoresistive element including bias magnetic field application means, FIGS. 3(a)–3(d) illustrate the effect of variable x axis magnetic fields on magnetisation vector M, FIG. 4, portrays a graph of the relationship between resistivity and x axis magnetic field for various y axis magnetic fields, FIGS. 5(a) and 5(b) illustrate the rotation of magnetisation vector M with both x and y axis bias magnetic fields, FIG. 6, illustrates the shift in resistivity values associated with x and y components of a residual external magnetic field, FIG. 7, illustrates a circuit for sampling resistivity with application of the appropriate bias magnetic fields, FIGS. 8(a)–8(d) illustrate the sequence of, sampling and bias magnetic field application.

Referring to FIG. 1, there is shown an arbitrary three dimensional orthogonal co-ordinate system defining positive x, y and z axes. A magnetoresistive (MR) element 1 is arranged to lie in the x-y plane with its longer axis directed along the y axis. The MR element may typically comprise an 80% nickel, 20% iron alloy, although clearly other magnetoresistive components may be utilized. A layer 0.04 $\mu$m thick of the above alloy is vacuum deposited in a strip 50 $\mu$m wide and 500 $\mu$m long onto an oblong shaped electrical insulator, for example a glass slide 2; the glass slide already having attached at each end by adhesive for example, electrical pads 3, which are connected to wires 4 and 5 respectively by any suitable means. A vacuum deposited layer 6 of gold for example, may provide electrical connection between the MR element end areas and pads 3. It will be apparent that deposition techniques other than vacuum deposition and dimensions other than those specified may be used.

In the presence of a residual external magnetic field with magnitude $h_{+y}$ along the positive y axis, and with magnitude $h_{+x}$ along the positive x axis, the resistivity of the MR element 1 will vary dependent on the relative magnitudes of these magnetic field components, $h_x$ and $h_y$.

Further components of magnetic field, that is to say an applied bias field, may be added by means of the arrangement shown in FIG. 2. A conductor 7, comprising copper for example, may be vacuum deposited to a width of 100 $\mu$m, in a reverse C shape, onto an electrically insulating substrate 11, a glass sheet for example. A thin film of an electrically insulating material, photoresist for example, may then be coated onto the conductor 7 covering a region 12.

A layer of suitable magnetoresistive material 8 with dimensions similar to those disclosed hereinabove for FIG. 1, may be vacuum deposited onto the central region of conductor 7, such that it forms a MR element and occupies a position directly above and electrically insulated from conductor 7. The vacuum deposition of the magnetoresistive material is carried out in the presence of a magnetic field directed along the y axis, thereby ensuring that the magnetic film is anistropic having an easy direction of magnetisation aong the y axis. Two conductors 9 and 10, comprising copper for example, are vacuum deposited to overlap the narrow ends of MR element 8 and to form a C shape primarily superimposed on the reverse C form of conductor 7.

Region 12 is further coated with an electrically insulating material to ensure electrical insulation between MR element 8 and a strip of conducting material 13, subsequently vacuum deposited perpendicular to the long axis of and arranged to overlay the central region of, the MR element. Six wires 14 to 19 are fixed as illustrated to their respective conductors at points A by means of adhesive, for example, and electrical connnection between each wire and conductor achieved by vacuum deposition of a conductor material such as gold onto an area B around each point A.

In operation, passage of current from wire 15 to wire 14 through conductor 7 would establish a bias magnetic field $H_1$ along the positive x axis, whereas the passage of current from wire 16 to wire 17 through conductor 13 would establish a bias magnetic field $H_2$ along the positive y axis. The resistivity variation of the MR element 8 with these applied bias fields may be observed by examination of the resistance between wires 18 and 19 connected to conductors 9 and 10 respectively.

In the presence of neither a bias magnetic field nor a residual external magnetic field, magnetisation vector M, associated with the MR element points either along the positive y axis as illustrated in FIG. 3(a), or along the negative y axis. The up or down state may be selected by application of a short field pulse in the appropriate y direction, greater than the anistropy field of the MR film. Assuming the magnetisation vector has a zero z component, which is likely in view of the known inherent difficulty of rotation in the z direction in such an MR element at magnetic field levels below approximately 50 oersteds, then the MR element attains in this state, its maximum resistivity value $R_o$.

Application of a current of variable magnitude and direction through conductor 7 will create a magnetic field $H_{+x}$ or $H_{-x}$ along the positive and negative x axes, rotating the vector M away from the y axis by a variable angle O as illustrated in FIG. 3(b), for the case where the magnetisation vector was initially along the positive y axis as in FIG. 3(a). Consequently the MR element resistivity monitored by wires 18 and 19 will, as is well known, alter, and this variation is portrayed as curve 1 of FIG. 4.

The passage of a constant current through conductor 13, flowing from 16 to 17, will establish a bias magnetic field $H_{+y}=H_2$ along the positive y axis. Continued application of the variable x axis bias field compels the magnetisation vector to rotate away from the y axis; however, the extent to which it travels is reduced to a smaller variable angle O as a consequence of the applied bias field in the y axis as shown in FIG. 3(c). Therefore the variation of the resistivity of the MR element with variable x axis bias field is diminished and produces curve 2 of FIG. 4.

The same characteristic curve (2 of FIG. 4) is obtained when the magnetisation vector initially points along the negative y axis and bias magnetic field $H_{-y}=H_2$ is applied along the negative y axis by a current through conductor 13 flowing from 17 to 16. This magnetic state is shown in FIG. 3(d).

Examining first the occurrence of a non-zero residual external magnetic field component along the positive y axis being equal to $h_{+y}$. Application of the y axis bias fields will yield two different total fields in the y axis, that is $H_{+y}=H_2+h_{+y}$ and $H_{-y}=H_2-h_{+y}$. It is apparent that in the latter case the bias field has been reduced, thus allowing an increased rotation of magnetisation vector M when a variable x-axis bias field is applied resulting in curve 4 of FIG. 4. Conversly the positive y axis bias field is accentuated, further inhibiting movement of magnetisation vector M in a variable x-axis bias field leading to curve 3 of FIG. 4.

Allowing now a constant current in either direction to be passed through conductor 7, establishing a bias magnetic field $H_{+x}=H_1$ or $H_{-x}=H_1$ in the x axis, curves 3 and 4 will no longer apply. Instead, the magnetisation vector M will switch between four states, one for each alternative of the combination of y axis bias field and x axis bias field as illustrated in FIGS. 5(a) and 5(b), therefore establishing the points A, B, C and D marked on FIG. 4.

Considering now the case of a non-zero residual external magnetic field $h_{+x}$ along the positive x axis. This will modify the x axis bias field to $H_{+x}=H_1+h_{+x}$ and $H_{-x}=H_1-h_{+x}$. Consequently the points of intersection on curves 3 and 4 for a residual external y axis field will be shifted, producing new points A', B', C' and D' as illustrated on FIG. 6.

Clearly, the values of resistivity at these points may be utilized to establish the magnitudes of the respective components of the residual external field $h_{+x}$ and $h_{+y}$. It will be apparent to those skilled in the art that the x axis component $h_{+x}$ will be related to the resistivities $$-[(B'+D')-(A'+C')]$$

and the y axis component $h_{+y}$ related to the resistivities $$(B'+A')-(D'+C')$$

A circuit to enable samples at points A', B', C' and D' to be taken, in combination with application of the appropriate bias fields is shown in FIG. 7. A MR element 23 is arranged to lie within x axis and y axis bias magnetic fields established by coils 20 and 21 respectively. Other means of establishing a magnetic field may be utilized. A voltage source V is coupled across a constant current unit 24 in series with the MR element 23. The voltage fluctuations across the MR element resulting from magnetic field variations are amplified and inverted by an amplifier 25 before being available for sampling as representations of resistivity changes.

A timing control unit 26 ensures co-ordination between sampling and application of the appropriate bias field. As mentioned hereinabove, the magnetisation vector M of the MR element generally points along the y axis without the action of a magnetic field, resulting in a resistivity value of $R_o$. Since domain formation within the element can alter this state, it is preferable before sampling to ensure a correct value of $R_o$ by application of a polarity pulse field along the y axis, that is to say, establish a magnetic field along the y axis equivalent to the anistropy field $H_p$ for example. Therefore at the start of a first cycle a first clock pulse, relayed from a clock 27 to unit 26 causes this unit to instruct a Y polarity unit 28 to ensure that a mixing and power amplifier unit 29 activates coil 21 to establish a y axis magnetic field $H_{+y}=H_p$ in the region surrounding MR element 23, thus pointing magnetisation vector M along the y axis.

Simultaneously, Y bias unit 30 is instructed to ensure that the Y coil amplifier 29 would establish a bias field $H_2$ along the positive y axis in the absence of a polarity pulse field. A second clock pulse received at unit 26, terminates the polarity pulse field, leaving the y axis bias field $H_2$. A third clock pulse activates timing control unit 26 to cause an X bias unit 31 to ensure that a mixing and power unit 32 activates coil 20 to establish a field $H_1$, along the positive x axis. These pulsing sequences are illustrated in FIGS. 8(a), (b), and (c).

The arrival of a fourth clock pulse at unit 26 initiates the transmission of a pulse from unit 26 to sample and hold units S1 and S3 as shown in FIG. 8(d). These two units on reception of the pulse immediately sample and store the output from amplifier 25, which is representative of the point B' in FIG. 6. A fifth clock pulse received at control unit 26 causes it to reverse the x bias field and a sixth clock pulse initiates the transmission of a pulse from the unit to sample and hold units S2 and S3 to activate sampling. These samples obtained and stored being representative of point A' in FIG. 6. A seventh clock pulse received by control unit 26 results in it ensuring the de-activation of coils 20 and 21, while an eighth clock pulse terminates the first cycle of sampling.

The first clock pulse of a second cycle, received at control unit 26 initiates a Y polarity pulse from unit 28 to establish a polarity pulse field $H_{-y}=H_p$ in the vicinity of MR element 23 and ensures that Y coil amplifier would establish a bias field $H_2$ along the negative y axis in the absence of a polarity pulse field. The subsequent bias field applications and sampling for this cycle by sample and hold units S1 and S3 then S2 and S4 are similar to those of the first cycle and are clearly set out in FIG. 8. The sample taken by units S1 and S3 is representative of point D' and that for units S2 and S4 being representative of points C', in FIG. 6 When a sample and hold unit receives a second sample representative of a different point, the sample is added into the unit store and then the store contents are transferred to a subtractor 33 or 34, the unit store being subsequently cleared. In the case of sample and hold unit S1, during the first and second cycle it receives samples of B' and D' respectively, their sum (B'+D') is then transferred to the positive terminal of subtractor 33. The negative terminal of this subtractor receives the output from sample and hold unit 52, representative of the sum of samples A' and C'. From the equation disclosed hereinbefore, the resultant output from the subtractor 33 bears a known relationship to the x component of residual external magnetic field in the region around the MR element 23 at the time of sampling.

The similar sample and hold units S3 and S4 transfer representations of the sum of samples B' and A' from S3 to the positive terminal of subtractor 34, and sum of samples D' and C' from S4 to the negative terminal. From the equation disclosed hereinbefore, the resultant output from the subtractor 34 bears a known relationship to the y component of residual external magnetic field in the region around the MR element 23 at the time of sampling.

Some slight heating of the MR element may occur as a result of the relatively high currents required for the bias fields and polarity pulses. Consequently it is preferable if the sampling sequence of say, B' before A' and D' before C' is reversed. Therefore it is arranged that during a third and fourth cycle, A' is sampled before B' and C' before D' as illustrated in FIG. 8. In this manner all samples are taken in a period when the MR element may be warming slightly and when it may be cooling slightly. A typical sampling frequency in this sequence of four cycles is 200 Hz, observing for a millioersted residual external field, a 0.001% change in resistivity values, with a bias field created by a 200 m A current. Clearly sampling sequences other than herein described may be utilized.

It is therefore possible to measure two components of residual external magnetic field with the use of one magnetoresistive element in a single spatial position.

Clearly, in the case of strong residual external fields the points A', B' C' and D' may be shifted to relatively non-linear sections of the resistivity curve. Application of controlled feedback to the bias fields by means of units 35 and 36 of FIG. 7 may return the points to the linear regions allowing the MR element to be sensitive to small variations in large magnetic fields. It will be clear that in certain instances the application of the bias magnetic field $H_2$ may be disregarded. The invention may also for example be utilized as a compass, sensing magnetic field strength in addition to angle.

It will be appreciated that the construction of timing control unit 26 would be apparent to a person skilled in the art. It will also be apparent that the embodiment illustrated shows and application of the invention in one form only for the purposes of illustration. In practice the invention may be applied to a number of different configurations, the detailed embodiments being straightforward for those skilled in the art to implement.

What I claim is:

1. Apparatus for sensing first and second orthogonal components $h_x$ and $h_y$ of an external magnetic field h, said apparatus including a planar magnetoresistive element, said element comprising a magnetically anisotropic thin film having an easy axis of magnetization in the plane of the film, said film being provided with electrical contacts connectable to means for passing an electrical current through the film in a direction substantially parallel to said easy axis, said contacts also being connectable to detecting means for sensing a signal indicative of the resistivity of said film when said current is passed therethrough, said apparatus further including application means for selectively applying to the film a first magnetic bias field and a second magnetic bias field, said first bias field acting substantially at right angles to said easy axis in the plane of the film and said second bias field acting substantially parallel to said easy axis, and control means permitting said first and second bias fields to be applied to said element in a plurality of pre-determined relationships, said element, in use, being placed in said external magnetic field h with said component $h_x$ lying in a direction at right angles to said easy axis in the plane of the film and said component $h_y$ lying parallel to said easy axis, and said detection means sensing signals indicative of the resistivity of said film whilst said application means selectively applies said first and second bias fields in a plurality of different relationships, said relationships being chosen such that said components $h_x$ and $h_y$ may be derived from said signals.

2. Apparatus according to claim 1 wherein said application means selectively reverses the directions of said bias fields such that said first magnetic bias field initially has a value $+H_1$ which may be reversed to $-H_1$ and said second magnetic bias field initially has a value $+H_2$ which may be reversed to $-H_2$, said control means causing said first and second bias fields to be simultaneously applied and said detection means sensing signals, A', B', C' and D' under conditions of simultaneously applied bias fields as follows:

A' represents film resistivity with $H_2$ positive and $H_1$ negative

B' represents film resistivity with $H_2$ positive and $H_1$ positive

C' represents film resistivity with $H_2$ negative and $H_1$ negative

D' represents film resistivity with $H_2$ negative and $H_1$ positive, whereby said component $h_x$ is related to $[(A'+C')-(B'+D')]$ and said component $h_y$ is related to $[(B'+A')-(D'+C')]$.

3. Apparatus according to claim 1 wherein said element comprises a nickel iron alloy deposited on to an insulating planar substrate.

4. Apparatus according to claim 1 wherein said application means for applying said first bias field includes at least one planar electrical conductor, said conductor lying adjacent said film and electrically insulated from said film, said conductor being connectable to an electrical current source to cause an electrical current to flow through said conductor in a direction substantially parallel to said easy axis.

5. Apparatus according to claim 1 wherein said application means for applying said second bias field includes at least one planar electrical conductor, said conductor lying adjacent said film and electrically insulated from said film, said conductor being connectable to an electrical current source to cause an electrical current to flow through said conductor in a direction substantially at right angles to said easy axis.

6. Apparatus according to claim 1 wherein said control means includes a timing control circuit connected to said application means, said timing control circuit enabling said application means to repeatedly apply said first and second bias fields in said chosen plurality of different relationships in a particular sequence, whereby said signals indicative of the resistivity of said film are repeatedly generated in correspondence to said particular sequence.

7. Apparatus according to claim 1 wherein said detection means includes respective sampling units for each of said chosen relationships, each of said sampling units being connected to said timing control circuit, causing each of said signals to be independently sampled.

* * * * *